United States Patent
Schnell (10) Patent No.: US 11,798,604 B2
(45) Date of Patent: Oct. 24, 2023

(54) MEMORY ARCHITECTURE HAVING RANKS WITH VARIABLE DATA WIDTHS

(71) Applicant: Dell Products L.P., Round Rock, TX (US)

(72) Inventor: Arnold Thomas Schnell, Hutto, TX (US)

(73) Assignee: Dell Products L.P., Round Rock, TX (US)

( * ) Notice: Subject to any disclaimer, the term of this patent is extended or adjusted under 35 U.S.C. 154(b) by 64 days.

(21) Appl. No.: 17/464,407

(22) Filed: Sep. 1, 2021

(65) Prior Publication Data

US 2023/0061878 A1    Mar. 2, 2023

(51) Int. Cl.
*G11C 7/22* (2006.01)
*G11C 7/10* (2006.01)

(52) U.S. Cl.
CPC ............ *G11C 7/222* (2013.01); *G11C 7/1048* (2013.01); *G11C 7/1066* (2013.01); *G11C 7/1093* (2013.01)

(58) Field of Classification Search
CPC .................................. G11C 7/222; G11C 7/22
USPC ....................................................... 365/233.1
See application file for complete search history.

(56) References Cited

U.S. PATENT DOCUMENTS

| | | | | |
|---|---|---|---|---|
| 6,601,130 | B1 * | 7/2003 | Silvkoff | G11C 8/12 365/230.03 |
| 7,864,604 | B2 * | 1/2011 | David | G11C 5/04 365/198 |
| 8,437,164 | B1 * | 5/2013 | Law | G11C 5/063 365/72 |
| 2008/0077747 | A1 * | 3/2008 | Hur | G11C 7/1048 711/149 |
| 2015/0302904 | A1 * | 10/2015 | Yoon | G11C 5/04 711/147 |
| 2020/0066330 | A1 * | 2/2020 | Hu | G11C 11/40618 |
| 2022/0214974 | A1 * | 7/2022 | Li | G06F 12/10 |
| 2022/0321183 | A1 * | 10/2022 | Khoshnevisan | H04W 72/046 |

* cited by examiner

*Primary Examiner* — Muna A Techane
(74) *Attorney, Agent, or Firm* — KIRTON MCCONKIE; Brian Tucker (57) ABSTRACT

Ranks of one or more memory modules can have variable data widths. As part of initializing a memory architecture, a memory controller can be configured to detect the data width of the ranks in the memory architecture. Based on the detected data widths of the ranks, the memory controller can synchronize the clocks and chip select signals of multiple ranks to thereby cause one or more memory chips in each of the multiple ranks to be connected to the shared data lines at the same time.

20 Claims, 12 Drawing Sheets

MEMORY ARCHITECTURE HAVING RANKS WITH VARIABLE DATA WIDTHS

CROSS-REFERENCE TO RELATED APPLICATIONS

N/A

BACKGROUND

A memory chip is an integrated circuit that stores data. In the context of personal computer memory, a memory chip is typically in the form of dynamic random-access memory (DRAM). A memory module consists of a circuit board on which multiple memory chips are mounted. Different types of memory modules are commonly used on personal computers including single in-line memory modules (SIMMs), dual in-line memory modules (DIMMs) and small outline DIMMs (SODIMMs).

A personal computer's memory architecture typically includes a memory controller and one or more memory modules. The CPU interfaces with the memory controller over a system bus to access data stored in the memory chips on the one or more memory modules.

In memory terminology, a "rank" is a set of memory chips that are connected to the same chip select signal. A rank has a fixed data width of 64 bits or 32 bits, and a memory module may include multiple ranks. With DDR, DDR2, DDR3 and DDR4 memory modules, each rank is connected to the memory controller via a channel consisting of 64 data lines and a clock and chip select signal is used to control when the rank loads data to/from these data lines. With DDR5, the channel is divided into two 32-bit subchannels and therefore a rank is also divided into two subchannels that are connected to the 32 data lines of the subchannels. Accordingly, there is a separate clock and chip select signal for each rank subchannel (e.g., a clock and chip select signal for rank 0, subchannel A and a separate clock and chip select signal for rank 0, subchannel B). To avoid ambiguity, rank 0, subchannel A and rank 0 subchannel B (or another rank number) should be considered as different ranks even though they are both referred to as rank 0 (or another rank number) because separate clock and chip select signals are used for these ranks.

The number of memory chips (or banks of memory chips) per rank can vary. For example, some memory chips have 8 data bits and therefore a rank would include 8 or 4 memory chips. As another example, some memory chips have 16 data bits and therefore a rank would include 4 or 2 memory chips. If error correction is provided, a rank may include an additional memory chip to provide error correction (i.e., 72 or 36 total bits per rank).

Figure 1:
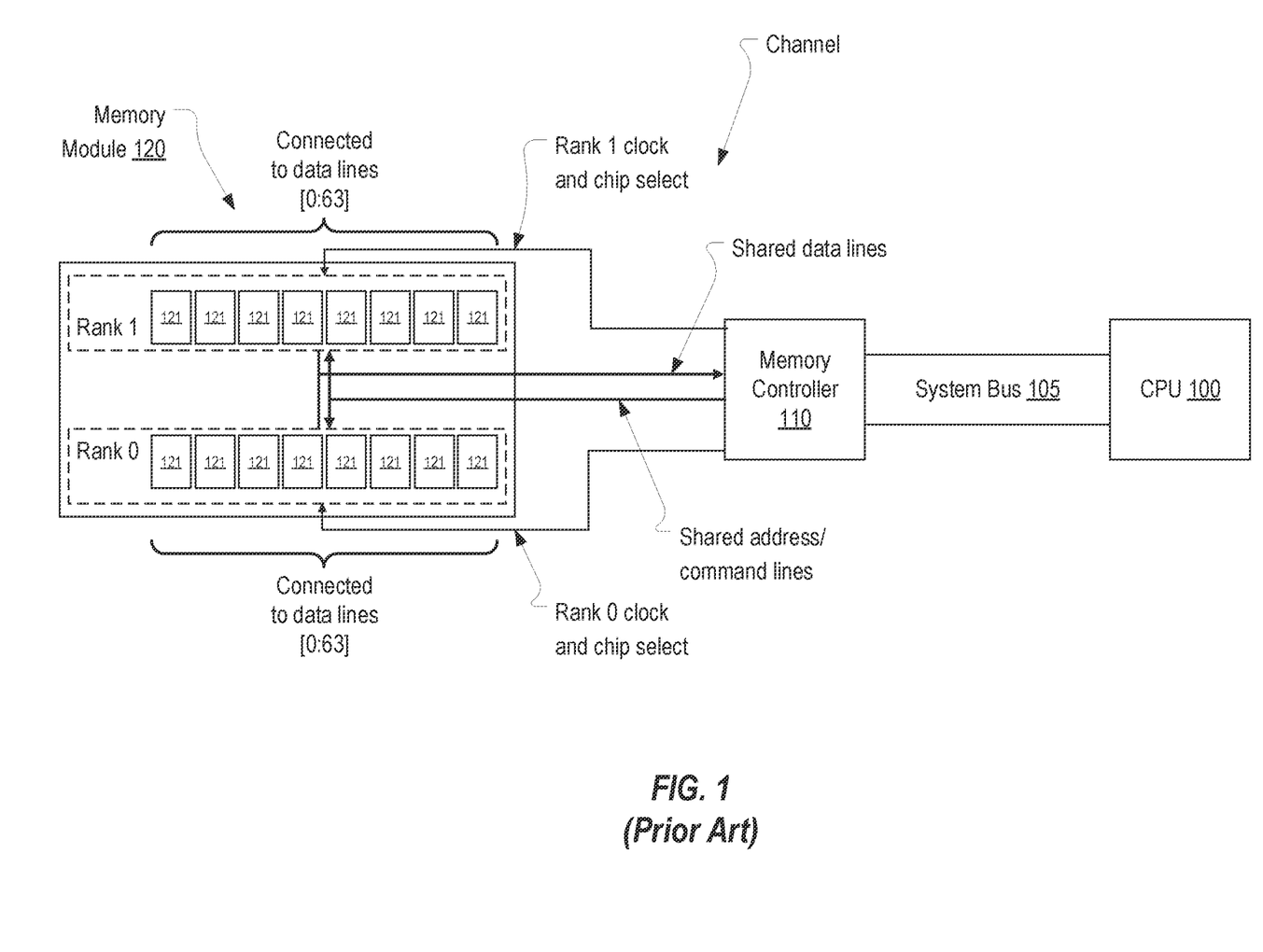
FIG. 1 illustrates an example of a memory architecture that supports DDR, DDR2, DDR3 and DDR4.

FIG. 1 provides an example of a memory architecture that includes a memory module 120 in the form of a SODIMM having two ranks, rank 0 and rank 1. As shown, a CPU 100 may be connected to a memory controller 110 via a system bus 105. Memory controller 110 may be connected to memory module 120 via a channel that includes 64 shared data lines, shared address/command lines and separate clock and chip select lines for each rank. Each rank includes 8 memory chips 121, each of which provides 8 data bits (i.e., one memory chip 121 is connected to data lines 0-7, another memory chip 121 is connected to data lines 8-15, etc.). For simplicity, error correction is not shown. In this example, because there are 64 data lines in the channel, memory module 120 could be a DDR, DDR2, DDR3 or DDR4 memory module.

To read data from or write data to memory chips 121 in rank 0, memory controller 110 can activate the chip select signal for rank 0 and 64 bits of data will be transferred over the shared data lines (8 bits to/from each memory chip 121 in rank 0) in accordance with the timing of the clock signal for rank 0 and the shared address/command lines. Likewise, to read data from or write data to memory chips 121 in rank 1, memory controller 110 can activate the chip select signal for rank 1 and 64 bits of data will be transferred over the shared data lines (8 bits to/from each memory chip 121 in rank 1) in accordance with the timing of the clock signal for rank 1 and the shared address/command lines.

Figure 2A:
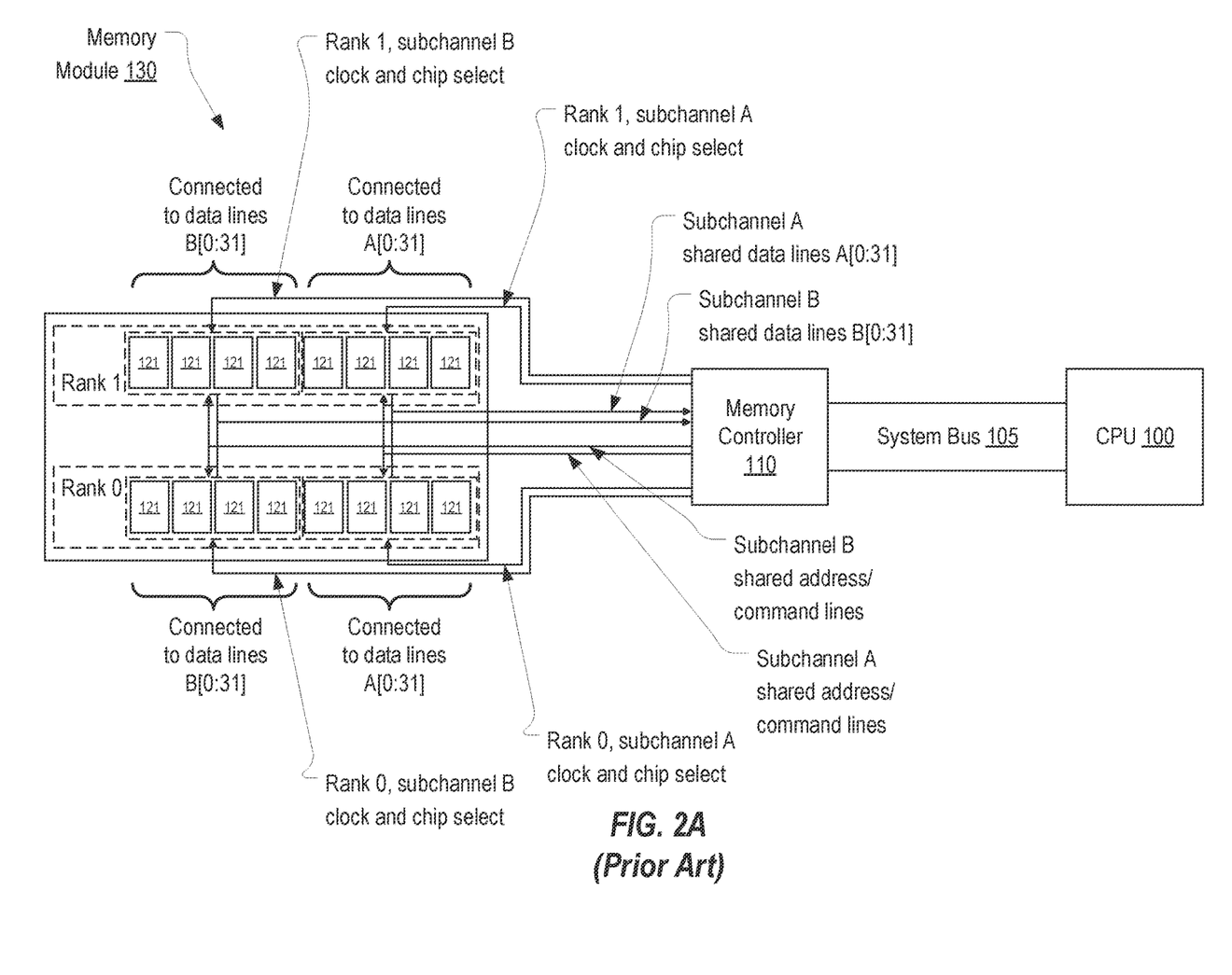
FIG. 2A illustrates an example of a memory architecture that supports DDR5.

FIG. 2A provides an example of a memory architecture that includes a memory module 130 in the form of a DDR5 SODIMM having four ranks with 32-bit data widths. As shown, the channel is divided into two subchannels, subchannels A and B, and therefore each rank is connected to one of these two subchannels. However, two ranks still share the same data lines. In particular, memory chips 121 in rank 0, subchannel A and in rank 1, subchannel A will share the 32 data lines in subchannel A (typically data lines [32:63]), while memory chips 121 in rank 0, subchannel B and in rank 1, subchannel B will share the 32 data lines in subchannel B (typically data lines [0:31]). Therefore, this memory architecture still requires four separate clock and chip select signals for the four ranks.

Figure 2B:
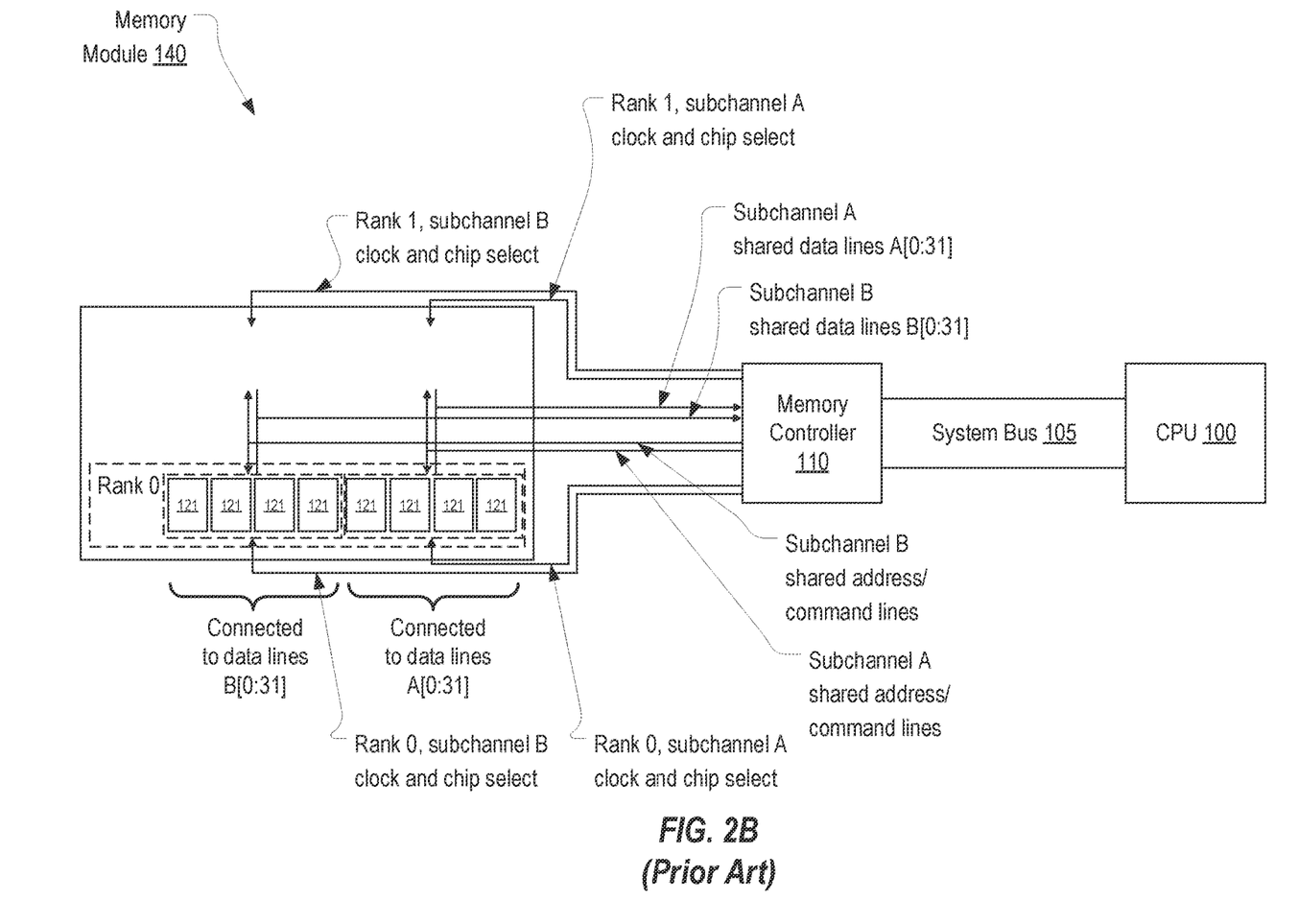
FIG. 2B illustrates an example of a memory architecture that supports DDR5 when a memory module includes fewer ranks than the memory architecture supports.

FIG. 2B, like FIG. 2A, provides a DDR5 SODIMM example except that memory module 140 only includes rank 0, subchannels A and B. In such a case, the clock and chip select signals for the rank 1, subchannels A and B are unused. Accordingly, every memory read and write will occur via rank 0, subchannels A and B. In particular, memory controller 110 will drive the clock, chip select and address/command signals for rank 0, subchannels A and B for every memory read or write.

In scenarios where the memory architecture includes fewer ranks than the maximum number of ranks it can handle, memory controller 110 would need to drive the clock, chip select and address/command signals at a higher frequency to maintain memory speeds. For example, to obtain the same memory speeds in the memory architecture depicted in FIG. 2B as those possible in the memory architecture depicted in FIG. 2A, memory controller 110 would have to drive the clock and chip select signals for rank 0, subchannels A and B at twice the frequency. However, there is a limit on how fast these signals can be effectively driven. For example, the capacitance of the clock and chip select lines that connect to each memory chip 121 in the rank can place an upper limit on the frequency at which the clock and chip select signals can be driven. As a result, when a memory architecture includes fewer ranks than the maximum it can support, memory speeds will likely be reduced.

BRIEF SUMMARY

The present invention extends to techniques for enabling variable data widths per rank and to memory architectures that are configured to employ variable data widths per rank. As part of initializing the memory architecture, a memory controller can be configured to detect the data width of the ranks in the memory architecture. Based on the detected data widths of the ranks, the memory controller can synchronize the clocks and chip select signals of multiple ranks to thereby cause one or more memory chips in each of the multiple ranks to be connected to the shared data lines at the same time.

In some embodiments, the present invention may be implemented as one or more memory modules that have multiple ranks where each of the multiple ranks is connected to a different subset of data lines in a channel or subchannel. These multiple ranks could include multiple ranks that are connected to different subsets of data lines in a subchannel A and multiple ranks that are connected to different subsets of data lines in a subchannel B. In some embodiments, there may be two ranks that are connected to different subsets of data lines in a subchannel. In some embodiments, there may be four ranks that are connected to different subsets of data lines in a subchannel.

In some embodiments, the present invention may be implemented as one or more memory modules that include multiple ranks that each have a data width of 16 bits or 8 bits. The multiple ranks could include four ranks that each have a data width or 16 bits. These four ranks could include two ranks that are connected to a first sub channel and two ranks that are connected to a second subchannel. The multiple ranks could also include eight ranks that each have a data width or 8 bits. These eight ranks could include four ranks that are connected to a first subchannel and four ranks that are connected to a second subchannel.

In some embodiments, the present invention may be implemented by a memory controller as a method for enabling memory modules to include ranks having variable data widths. The memory module can detect a data width of ranks on one or more memory modules. The memory module can then determine that the data width of the ranks is less than a width of a channel or subchannel of an interface between the memory controller and the one or more memory modules. Based on the determination, the memory controller can synchronize clock and chip select signals pertaining to two or more of the ranks.

This summary is provided to introduce a selection of concepts in a simplified form that are further described below in the Detailed Description. This Summary is not intended to identify key features or essential features of the claimed subject matter.

BRIEF DESCRIPTION OF THE DRAWINGS

Understanding that these drawings depict only typical embodiments of the invention and are not therefore to be considered limiting of its scope, the invention will be described and explained with additional specificity and detail through the use of the accompanying drawings in which.

DETAILED DESCRIPTION

Embodiments of the present invention encompass memory modules having ranks with less than 64-bit or 32-bit data widths, memory architectures that support memory modules having ranks with variable data widths and methods for supporting ranks of variable data widths. As an overview, a memory controller can be configured to detect the data width of each rank of a memory module. Based on the detected data width of each rank, the memory controller can determine if and how the clock and chip select signals should be synchronized. By synchronizing these signals, memory chips in multiple ranks can be simultaneously connected to the shared data lines in a channel or subchannel to perform a load.

Figure 3:
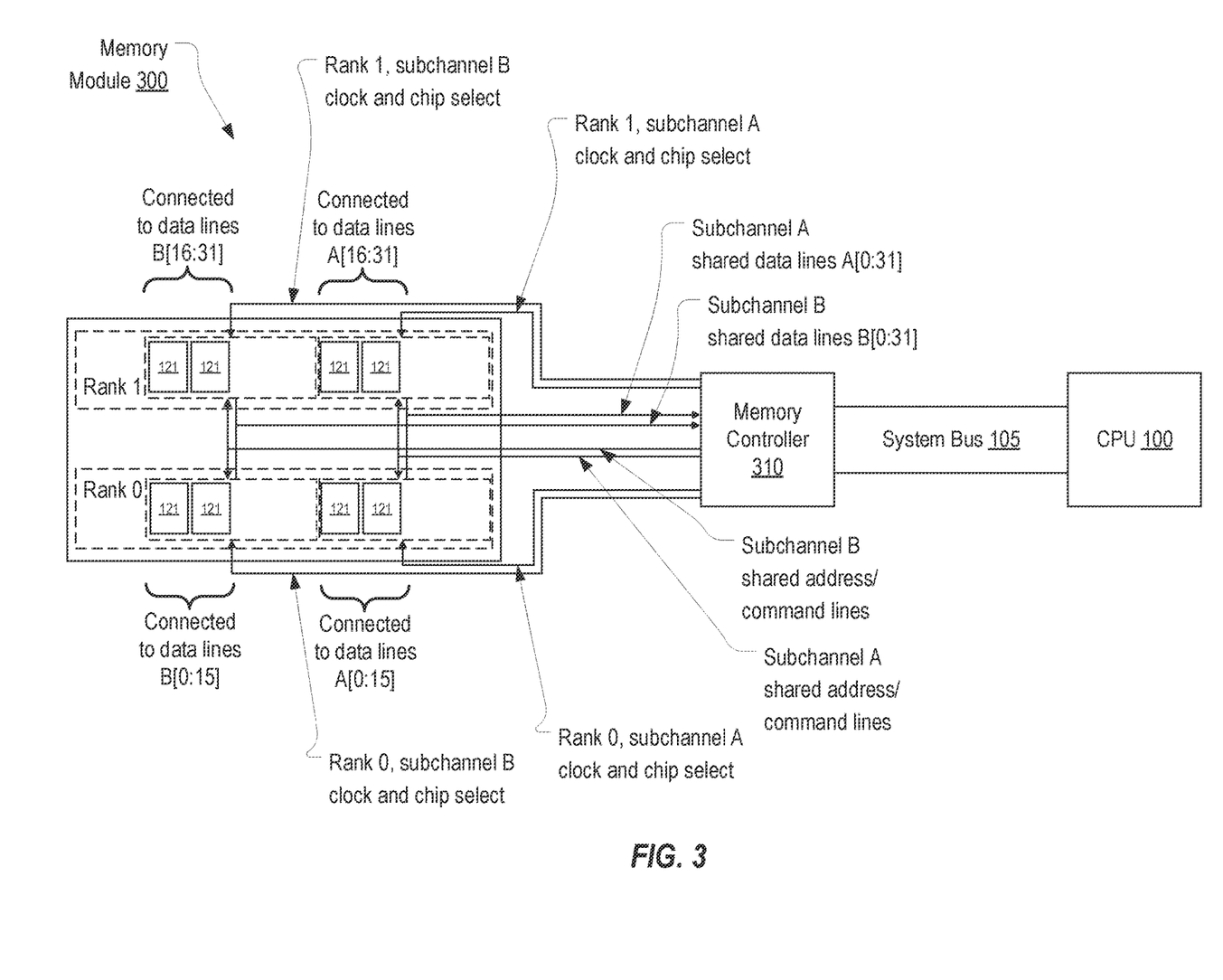
FIG. 3 illustrates an example of a memory architecture that supports DDR5 while enabling ranks to have variable data widths in accordance with one or more embodiments of the present invention.

FIG. 3 provides an example of a memory architecture that supports DDR5 while enabling ranks to have variable data widths in accordance with one or more embodiments of the present invention. This memory architecture includes CPU 100 that is connected to a memory controller 310 via system bus 105. Notably, memory controller 310 is connected to a memory module 300 via the standard DDR5 interface. In other words, the interface between memory controller 310 and memory module 300 is the same as the interface between memory controller 110 and memory modules 130 and 140 in FIGS. 2A and 2B respectively. Accordingly, when embodiments of the present invention are implemented in DDR5-compliant memory architectures, no changes in the memory interface are required.

In contrast to memory modules 130 and 140, memory module 300 includes ranks having a data width of 16 bits rather than 32 bits. In particular, rank 0, subchannel A includes two 8-bit memory chips 121 that are connected to only 16 data lines (A[0:15]) of the 32 data lines (A[0:31]) of subchannel A and rank 0, subchannel B includes two 8-bit memory chips 121 that are connected to only 16 data lines (B[0:15]) of the 32 data lines (B[0:31]) of subchannel B. Similarly, rank 1, subchannel A includes two 8-bit memory chips 121 that are connected to only 16 data lines (A[16:31]) of the 32 data lines of subchannel A and rank 1, subchannel B includes two 8-bit memory chips 121 that are connected to only 16 data lines (B[16:31]) of the 32 data lines of subchannel B. The choice of 8-bit memory chips is one example only and other sized memory chips could be used. Also, error correction, which would require another DRAM, is ignored to simplify this example.

Because memory chips 121 in rank 0, subchannel A are connected to data lines A[0:15] of subchannel A while memory chips 121 in rank 1, subchannel A are connected to data lines A[16:31] of subchannel A, these memory chips in two different ranks can be driven simultaneously to load the full 32 bits to/from data lines A[0:31] of subchannel A. Memory controller 310 can accomplish this by synchronizing the clock and chip select signals for rank 0, subchannel A and rank 1, subchannel A. Stated another way, memory controller 310 can mirror the clock and chip select signals for rank 1, subchannel A to match the clock and chip select signals for rank 0, subchannel A.

Likewise, because memory chips 121 in rank 0, subchannel B are connected to data lines B[0:15] of subchannel B while memory chips 121 in rank 1, subchannel B are connected to data lines B[16:31] of subchannel B, these memory chips in two different ranks can be driven simultaneously to load the full 32 bits to/from the data lines B[0:31] of subchannel B. Memory controller 310 can accomplish this by synchronizing the clock and chip select signals for rank 0, subchannel B and rank 1, subchannel B.

Notably, FIGS. 2B and 3 both represent scenarios where there would be 16 GB of memory available to CPU 100. However, the memory architecture of FIG. 3 would support faster memory speeds because the loading of the clock and chip select signals for rank 0, subchannels A and B would be cut in half. In particular, in FIG. 2B, all loads would be performed via the clock and chip select signals for rank 0, subchannels A and B while the clock and chip select signals for rank 1, subchannels A and B would remain unused. In contrast, in FIG. 3, half of the loads would be performed via the clock and chip select signals for rank 0, subchannels A and B and half of the loads would be performed via the synchronized clock and chip select signals for rank 1, subchannels A and B. Because only half of the loads are performed via these clock and chip selects signals, the signals can be driven at higher frequencies thus causing more loads to be performed in the same amount of time.

Figure 4:
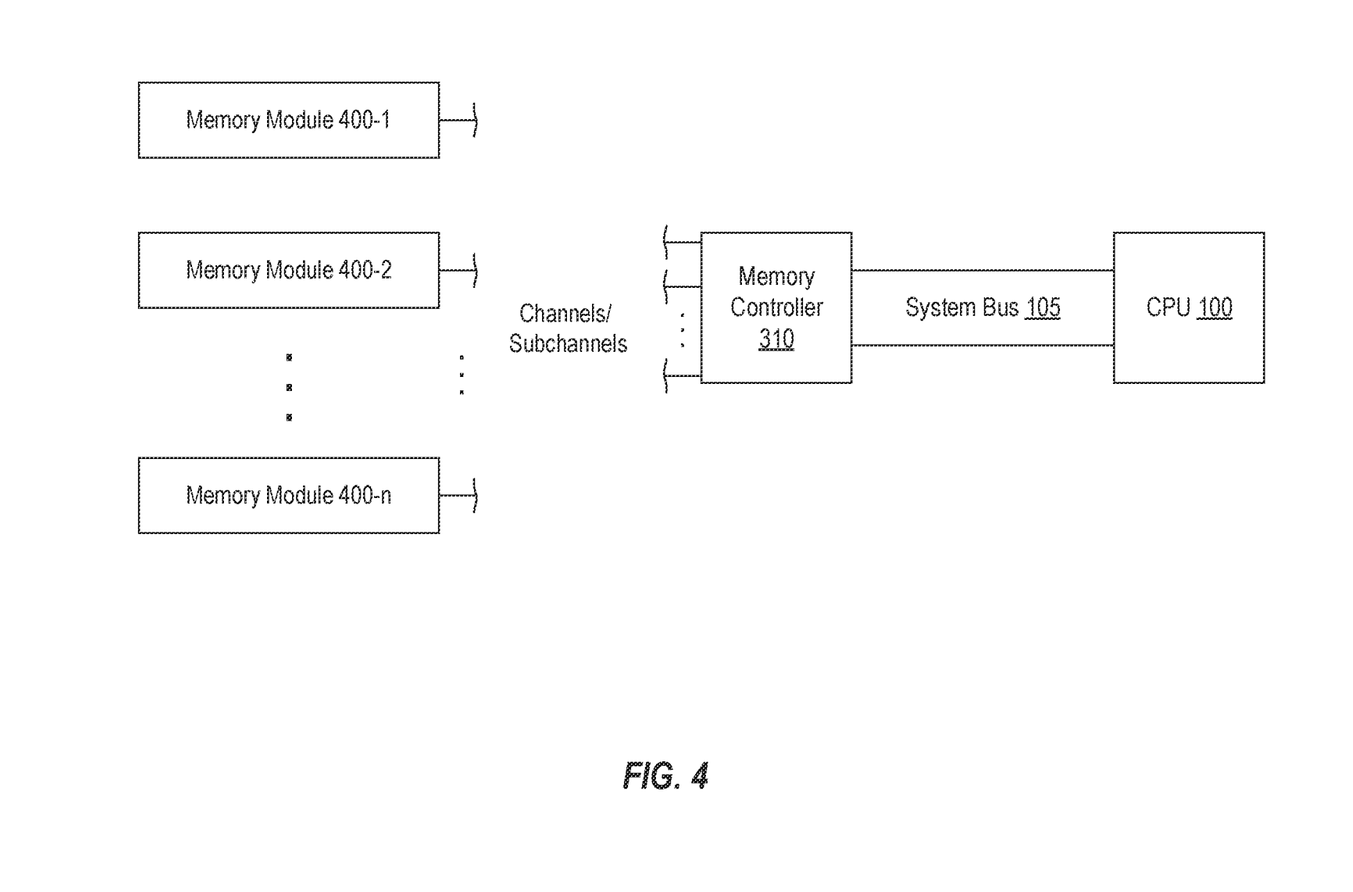
FIG. 4 represents that embodiments of the present invention can be implemented regardless of the number of memory modules and channels/subchannels that may exist in a memory architecture.

FIG. 3 represents a memory architecture with a single memory module. However, as represented in FIG. 4, embodiments of the present invention can be implemented when a personal computer includes a memory architecture with any suitable number of memory modules 400-1 through 400-n and/or with any suitable number of channels/subchannels.

Figure 4A:
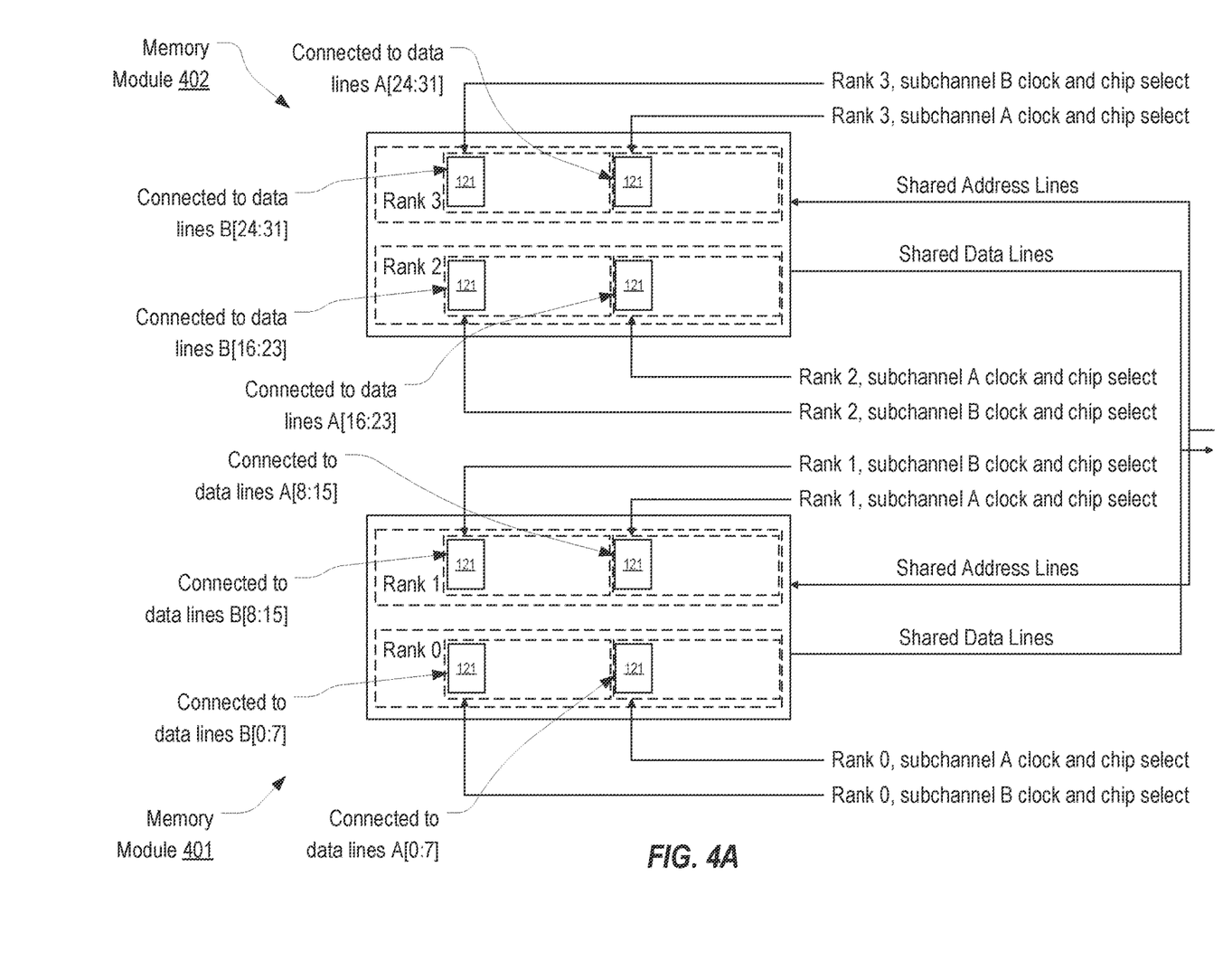
FIGS. 4A and 4B illustrate additional examples of memory architectures that supports DDR5 while enabling ranks to have variable data widths in accordance with one or more embodiments of the present invention.
Figure 4B:
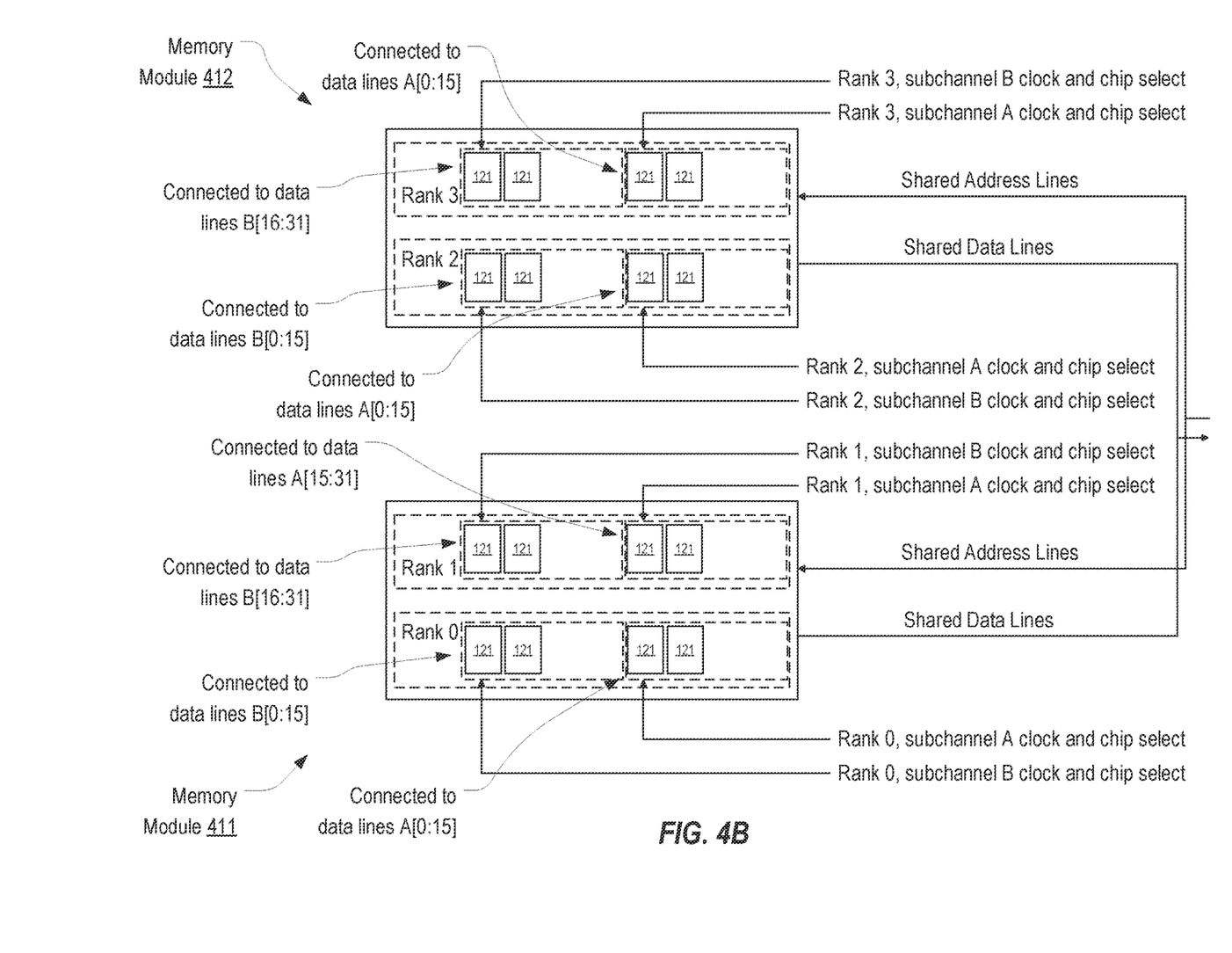

FIGS. 4A and 4B provide additional examples of a memory architecture that supports DDR5 while enabling ranks to have variable data widths in accordance with one or more embodiments of the present invention. In these examples, the memory architecture includes two memory modules that are connected to the subchannels of a single channel. However, the described techniques could be replicated on any suitable number of additional memory modules connected to the subchannels of any suitable number of channels. In FIG. 4A, there are two memory modules 401 and 402 that are connected to memory controller 310 (not shown) via the same channel. Memory module 401 includes four ranks, rank 0, subchannels A and B and rank 1, subchannels A and B. Memory module 402 also includes four ranks, rank 2, subchannels A and B and rank 3, subchannels A and B. Each of these ranks has a data width of 16 bits.

In particular, rank 0, subchannel A includes one 8-bit memory chip 121 that is connected to only 8 data lines (A[0:7]) of the 32 data lines (A[0:31]) of subchannel A and rank 0, subchannel B includes one 8-bit memory chip 121 that is connected to only 8 data lines (B[0:7]) of the 32 data lines (B[0:31]) of subchannel B. Rank 1, subchannel A includes one 8-bit memory chip 121 that is connected to only 8 data lines (A[8:15]) of the 32 data lines of subchannel A and rank 1, subchannel B includes one 8-bit memory chip 121 that is connected to only 8 data lines (B[8:15]) of the 32 data lines of subchannel B. Rank 2, subchannel A includes one 8-bit memory chip 121 that is connected to only 8 data lines (A[16:23]) of the 32 data lines of subchannel A and rank 2, subchannel B includes one 8-bit memory chip 121 that is connected to only 8 data lines (B[16:23]) of the 32 data lines of subchannel B. Rank 3, subchannel A includes one 8-bit memory chip 121 that is connected to only 8 data lines (A[24:31]) of the 32 data lines of subchannel A and rank 3, subchannel B includes one 8-bit memory chip 121 that is connected to only 8 data lines (B[24:31]) of the 32 data lines of subchannel B.

In a similar manner as described above, memory chips in four different ranks can be driven simultaneously to load the full 32 bits to/from the data lines A[0:31] of subchannel A. Memory controller 310 can accomplish this by synchronizing the clock and chip select signals for rank 0, subchannel A, rank 1, subchannel A, rank 2, subchannel A and rank 3, subchannel A. Stated another way, memory controller 310 can mirror the clock and chip select signals for rank 1, subchannel A, rank 2, subchannel A and rank 3, subchannel A to match the clock and chip select signals for rank 0, subchannel A.

Likewise, memory chips in four different ranks can be driven simultaneously to load the full 32 bits to/from the data lines B[0:31] of subchannel B. Memory controller 310 can accomplish this by synchronizing the clock and chip select signals for rank 0, subchannel B, rank 1, subchannel B, rank 2, subchannel B and rank 3, subchannel B.

FIG. 4A, like FIGS. 2B and 3, represents a scenario where there would be 16 GB of memory available to CPU 100. The memory architecture of FIG. 4A, in essence, spreads each load across four ranks. In comparison to a scenario where only rank 0, subchannels A and B were populated such that all loads would be performed via the clock and chip select signals for rank 0, subchannels A and B while the clock and chip select signals for the other ranks would remain unused, in FIG. 4A, only ¼ of these loads would be performed via the clock and chip select signals for rank 0 subchannels A and B.

FIG. 4B is similar to FIG. 4A but represents a scenario where there would be 32 GB of memory available to CPU 100. In FIG. 4B, there are two memory modules 411 and 412 that are connected to memory controller 310 (not shown) via the same channel. Memory module 411 includes four ranks, rank 0, subchannels A and B and rank 1, subchannels A and B. Memory module 412 also includes four ranks, rank 2, subchannels A and B and rank 3, subchannels A and B. Each of these ranks has a data width of 16 bits. In particular, each rank includes two 8-bit memory chips 121 that are connected to 16 data lines of either subchannel A or subchannel B. In rank 0, subchannel A and rank 2, subchannel A, two memory chips 121 are connected to data lines A[0:15] of subchannel A. In rank 0, subchannel B and rank 2, subchannel B, two memory chips 121 are connected to data lines B[0:15] of subchannel B. In rank 1, subchannel A and rank 3, subchannel A, two memory chips 121 are connected to data lines A[16:31] of subchannel A. In rank 1, subchannel B and rank 3, subchannel B, two memory chips 121 are connected to data lines B[16:31] of subchannel B.

In the memory architecture of FIG. 4B, to load 32 bits to/from the data lines A[0:31] of subchannel A, memory controller 310 can synchronize the clock and chip select signals for rank 0, subchannel A and rank 1, subchannel A or the clock and chip select signals for rank 2, subchannel A and rank 3, subchannel A. Similarly, to load 32 bits to/from the data lines B[0:31] of subchannel B, memory controller 310 can synchronize the clock and chip select signals for rank 0, subchannel B and rank 1, subchannel B or the clock and chip select signals for rank 2, subchannel B and rank 3, subchannel B.

FIGS. 4A and 4B both represent a single channel. As referenced above, a memory architecture configured in accordance with embodiments of the present invention could include two or more channels, and in such cases, the memory modules on the additional channel(s) could be configured in the manner shown in FIG. 4A or 4B. Also, because the memory interface is not changed, memory controller 310 can function in a traditional manner if traditional memory modules were connected. In other words, memory controller 310 can selectively perform the techniques of the present invention based on the configuration of the memory module(s) that may be present.

Figure 5:
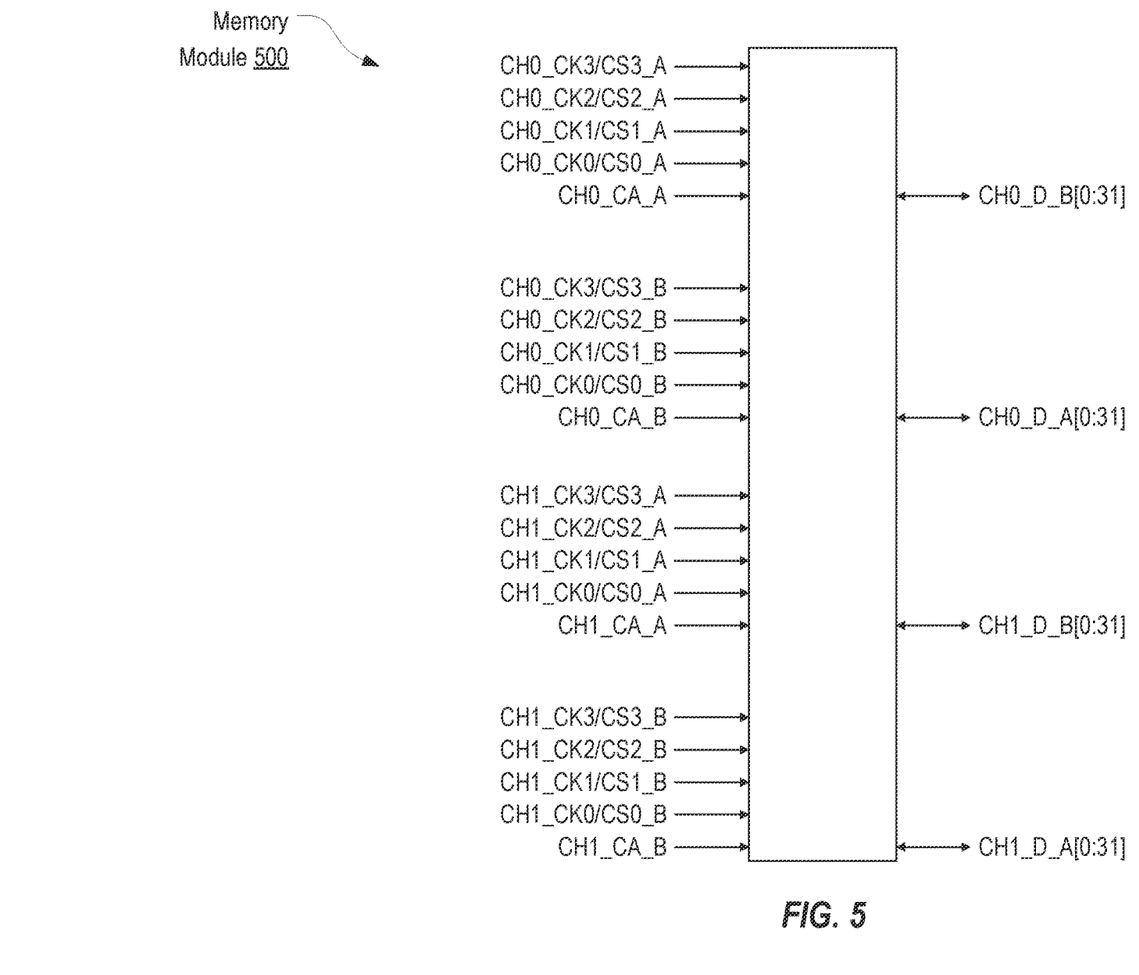
FIG. 5 illustrates a memory architecture in which a memory module includes the full interface of two memory channels.

FIG. 5 illustrates a memory module 500 that includes the full interface of two DDR5 memory channels. For example, memory module 500 could be equivalent to four SODIMMs. Therefore, from the perspective of memory controller 310 (not shown), the memory interface is the same, but the channels connect to the single memory module 500 rather than to multiple memory modules. Embodiments of the present invention can also be implemented in memory architectures that include one or more memory modules 500.

Figure 5A:
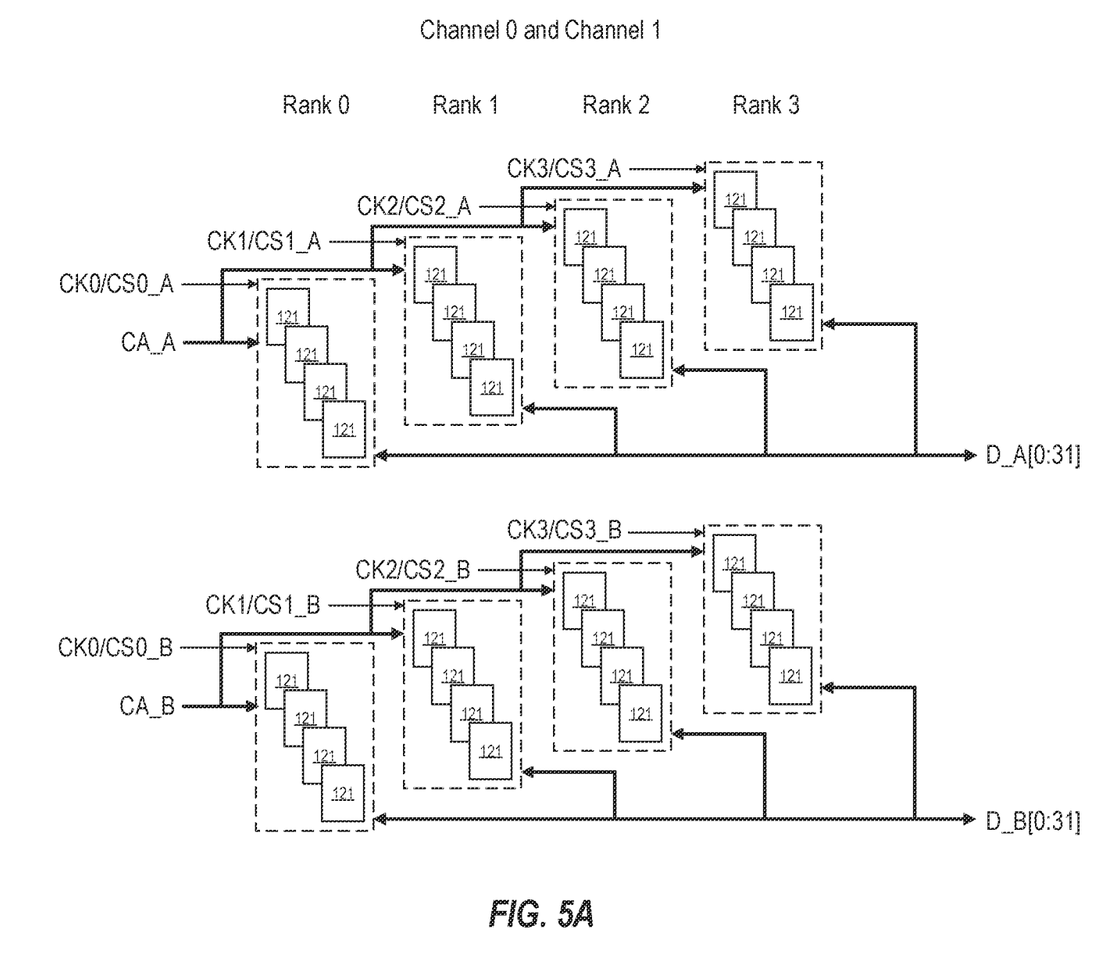
FIGS. 5A-5C provide examples of how variable data widths per rank can be supported in the memory architecture of FIG. 5.
Figure 5B:
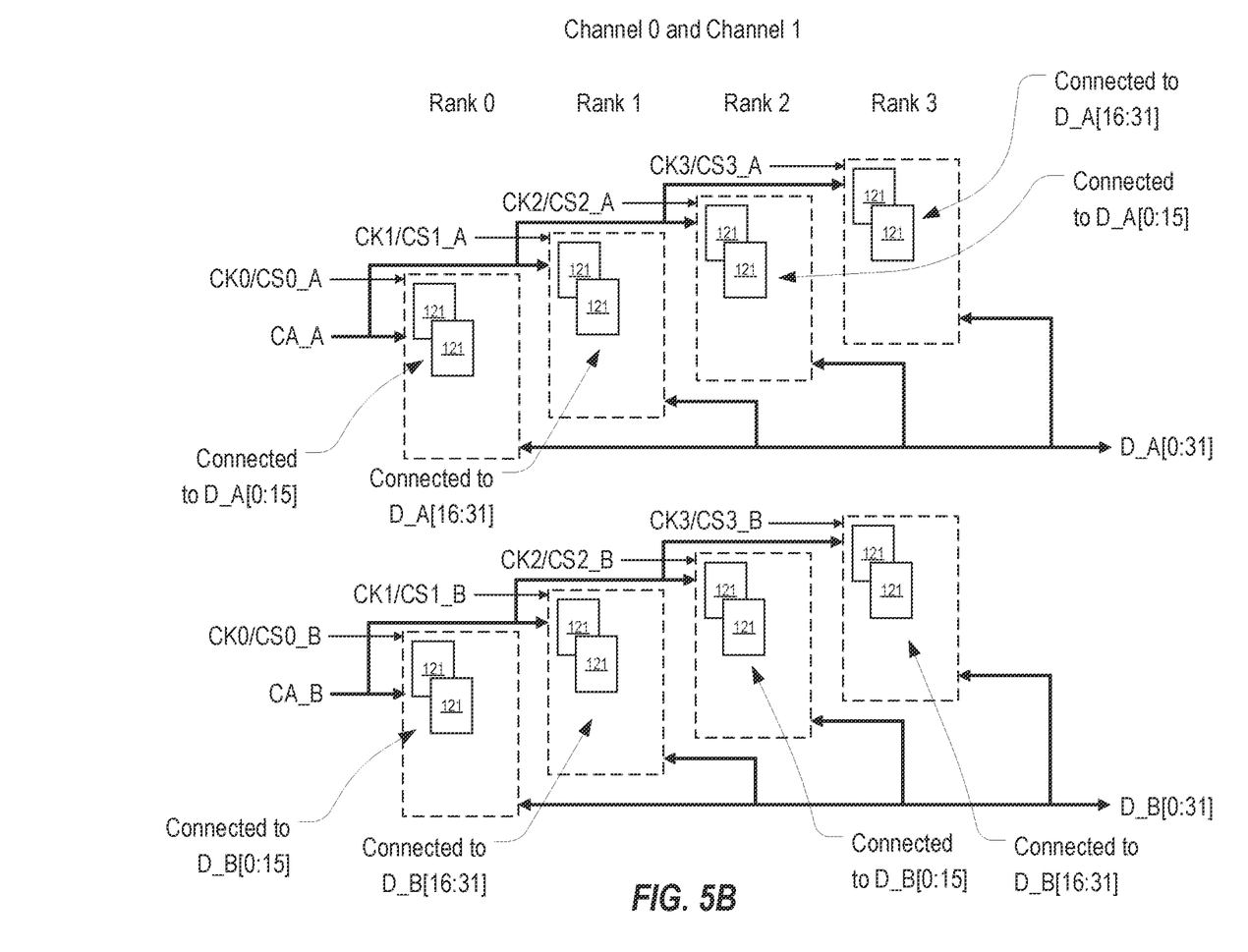
Figure 5C:
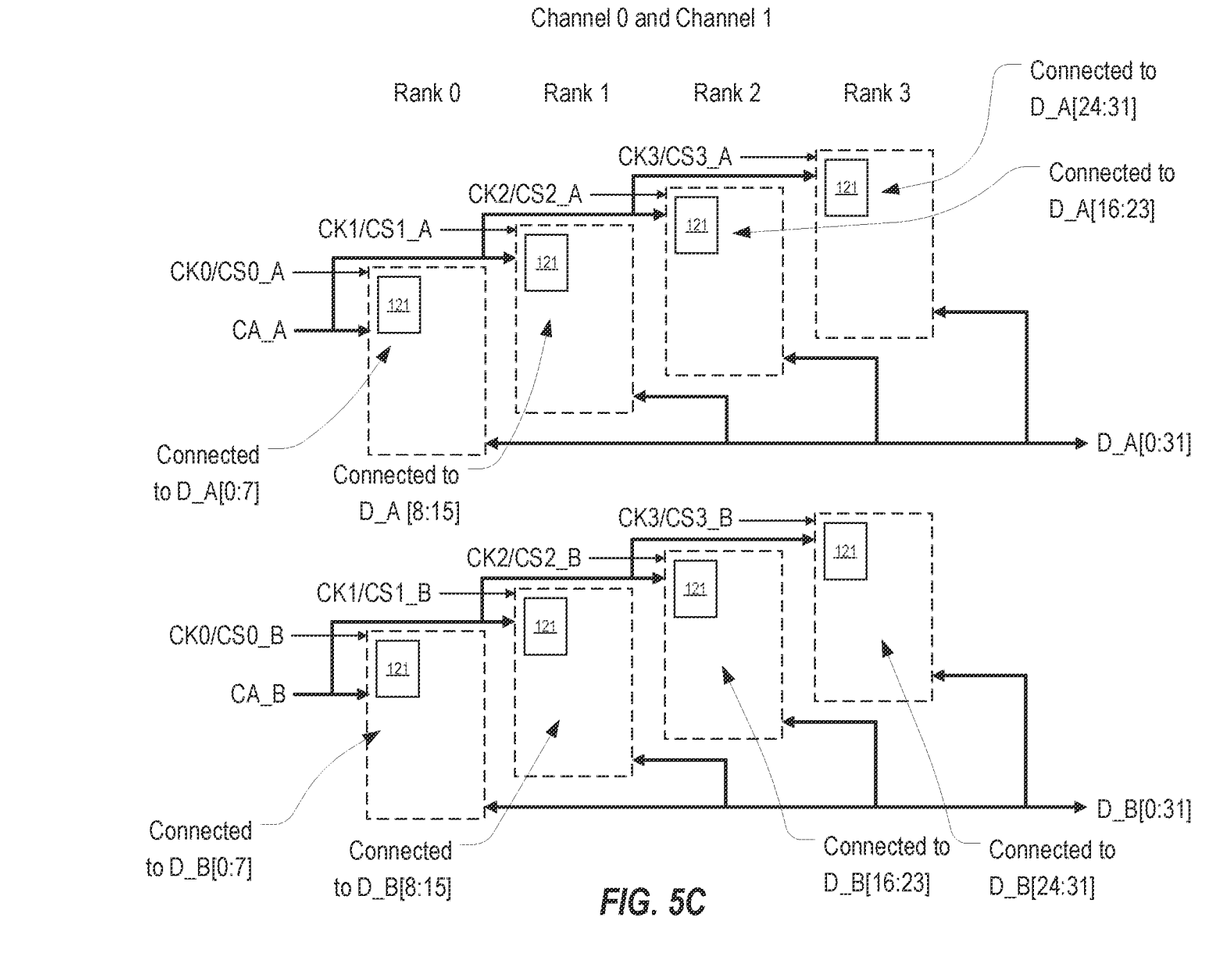

FIGS. 5A-5C each provide an example of a possible configuration of memory module 500. Because both channels 0 and 1 can be configured in the same manner, FIGS. 5A-5C depict a single channel to simplify the illustration.

In FIG. 5A, memory module 500 has a configuration in which the data width of each of the ranks is 32 bits. Therefore, in this configuration, a memory controller can access memory module 500 in a standard manner (i.e., without synchronizing the clock or chip select signals of any rank). With both channels configured as shown in FIG. 5A, there would be 128 GB of memory.

In FIG. 5B, memory module 500 has a configuration in which the data width of each of the ranks is 16 bits. In this configuration, the memory chips 121 in each rank are connected to the data lines in a similar manner as in FIG. 4B. In particular, the memory chips 121 in rank 0, subchannel A and rank 2, subchannel A share 16 data lines D A[0:15] in subchannel A and the memory chips 121 in rank 0, subchannel B and rank 2, subchannel B share 16 data lines D B[0:15] in subchannel B. Similarly, the memory chips 121 in rank 1, subchannel A and rank 3, subchannel A share the other 16 data lines D A[16:31] in subchannel A and the memory chips 121 in rank 1, subchannel B and rank 3, subchannel B share the other 16 data lines D B[16:31] in subchannel B. Therefore, in this configuration, a memory controller can synchronize the clock and chip select signals for rank 0, subchannel A and rank 2, subchannel A, the clock and chip select signals for rank 0, subchannel B and rank 2, subchannel B, the clock and chip select signals for rank 1, subchannel A and rank 3, subchannel A and the clock and chip select signals for rank 1, subchannel B and rank 3, subchannel B. With both channels configured as shown in FIG. 5B, there would be 64 GB of memory.

In FIG. 5C, memory module 500 has a configuration in which the data width of each rank is 8 bits. In this configuration, the memory chips 121 in each rank are connected to the data lines in a similar manner as in FIG. 4A. In particular, the memory chips 121 in each rank are connected to a different subset of 8 data lines. Therefore, in this configuration, a memory controller can synchronize the clock and chip select signals for each rank in the subchannel. With both channels configured as shown in FIG. 5C, there would be 32 GB of memory.

In each of the configurations shown in FIGS. 5A-5C, different memory capacities could be obtained by not populating some of the ranks while still enabling variable data widths per rank. For example, in FIG. 5B, rank 2, subchannels A and B and rank 3, subchannels A and B in both channels could be unpopulated to yield 32 GB of memory (16 GB per channel). In such a case, the clock and chip select signals for rank 0, subchannel A and rank 1, subchannel A could be synchronized, the clock and chip select signals for rank 0, subchannel B and rank 1, subchannel B could be synchronized and the clock and chip select signals for the other ranks could remain unused. Also, a memory architecture could support additional memory modules 500 which could be configured as described above.

Figure 6:
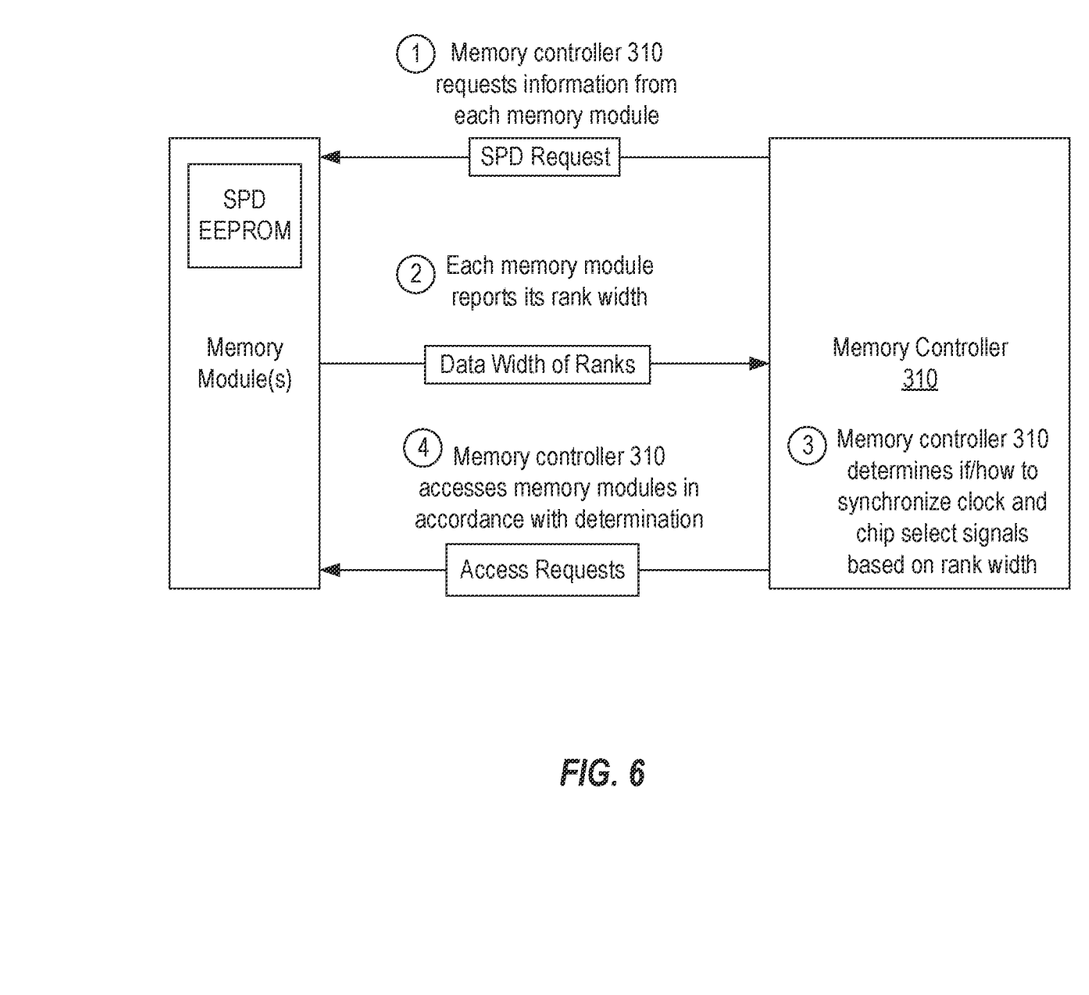
FIG. 6 provides an example of how a memory controller can support variable data widths per rank.

FIG. 6 provides an example of how memory controller 310 can determine the data width of the ranks of the memory module(s) in a memory architecture and then determine if/how the clock and chip selects should be synchronized. In step 1, which could be performed as part of initializing the memory architecture during the boot process on a personal computer, memory controller 310 can send a serial presence detect (SPD) request to each memory module to retrieve information from an SPD EEPROM on the memory module. This information can include the data width of the ranks on the memory module which can be returned to memory controller 310 in step 2. This information could also include an identification of which ranks are populated. In step 3 and in response to receiving the data width of the ranks on the memory module, memory controller 310 can determine if clock and chip select signals should be synchronized and if so, how the clock and chip select signals should be synchronized. For example, memory controller 310 can determine if the data width of the ranks is less than 64 bits (e.g., when the memory module is DDR, DDR2, DDR3 or DDR4) or less than 32 bits (e.g., when the memory module is DDR5). If not, memory controller 310 can determine that no clock or chip select signals need to be synchronized (i.e., that memory access can be performed in a standard manner). In contrast, if the data width of the ranks is less than 64 bits or 32 bits, memory controller 310 can determine that the clock and chip select signals for multiple ranks should be synchronized. In the case where the data width of the ranks is 32 bits per channel or 16 bits per subchannel, memory controller 310 can determine that the clock and chip select signals for one or more pairs of ranks should be synchronized. In the case where the data width of the ranks is 16 bits per channel or 8 bits per subchannel, memory controller 310 can determine that the clock and chip select signals for four ranks should be synchronized. Finally, in step 4, memory controller 310 can perform access requests (or read and write requests) to the memory module(s) in accordance with the determination made in step 3.

In summary, embodiments of the present invention enable a rank to have a variable data width without requiring any changes to the interface between the memory module(s) and the memory controller. By allowing ranks to have a variable width, the loading of the clock and chip select signals can be reduced to thereby enable performance scaling.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description.

What is claimed:
1. One or more memory modules comprising:
multiple ranks where each of the multiple ranks is connected to a different subset of data lines in a channel or subchannel, each of the multiple ranks including a set of memory chips that are connected to a same chip select signal such that the one or more memory modules include:

a first rank comprising a first set of memory chips that are connected to a first chip select signal and that are connected to a first subset of data lines in a channel or subchannel; and a second rank comprising a second set of memory chips that are connected to a second chip select signal different from the first chip select signal and that are connected to a second subset of data lines in the channel or subchannel.

2. The one or more memory modules of claim 1, wherein the multiple ranks include the first rank and the second rank that are connected to different subsets of data lines in subchannel A and a third rank and a fourth rank that are connected to different subsets of data lines in subchannel B.

3. The one or more memory modules of claim 2, wherein the first rank is rank 0, subchannel A, the second rank is rank 1, subchannel A, the third rank is rank 0, subchannel B and the fourth rank is rank 1, subchannel B.

4. The one or more memory modules of claim 2, wherein the multiple ranks include a fifth rank and a sixth rank that are also connected to the different subsets of data lines in subchannel A and a seventh rank and an eighth rank that are also connected to the different subsets of data lines in subchannel B.

5. The one or more memory modules of claim 1, wherein the multiple ranks include the first rank, the second rank, a third rank and a fourth rank that are each connected to different subsets of data lines in subchannel A and a fifth rank, a sixth rank, a seventh rank and an eight rank that are each connected to different subsets of data lines in subchannel B.

6. The one or more memory modules of claim 5, wherein the first rank is rank 0, subchannel A, the second rank is rank 1, subchannel A, the third rank is rank 2, subchannel A, the fourth rank is rank 3, subchannel A, the fifth rank is rank 1, subchannel B, the sixth rank is rank 1, subchannel B, the seventh rank is rank 2, subchannel B, and the eighth rank is rank 3, subchannel B.

7. The one or more memory modules of claim 1, wherein a data width of the multiple ranks is 16 bits or 8 bits.

8. One or more memory modules comprising:
multiple ranks that each have a data width of 16 bits or 8 bits, each of the multiple ranks including a set of memory chips that are connected to a same chip select signal, wherein the multiple ranks are configured to operate with synchronized clock and chip select signals pertaining to two or more of the ranks.

9. The one or more memory modules of claim 8, wherein the multiple ranks comprise four ranks that each have a data width of 16 bits.

10. The one or more memory modules of claim 9, wherein the four ranks include two ranks connected to a first subchannel and two ranks connected to a second channel.

11. The one or more memory modules of claim 8, wherein the multiple ranks comprise eight ranks that each have a data width of 8 bits.

12. The one or more memory modules of claim 11, wherein the eight ranks include four ranks that are connected to a first subchannel and four ranks that are connected to a second subchannel.

13. A method, performed by a memory controller, for enabling memory modules to include ranks having variable data widths, the method comprising:
detecting a data width of ranks on one or more memory modules;
determining that the data width of the ranks is less than a width of a channel or subchannel of an interface between the memory controller and the one or more memory modules; and
based on the determination, synchronizing clock and chip select signals pertaining to two or more of the ranks.

14. The method of claim 13, wherein detecting the data width of the ranks on the one or more memory modules comprises issuing one or more serial presence detect requests to the one or more memory modules.

15. The method of claim 13, wherein the interface includes two 32-bit subchannels and the data width of the ranks is determined to be 16 bits, and wherein the clock and chip select signals pertaining to two ranks are synchronized.

16. The method of claim 13, wherein the interface includes two 32-bit subchannels and the data width of the ranks is determined to be 8 bits, and wherein the clock and chip select signals pertaining to four ranks are synchronized.

17. The method of claim 13, wherein interface includes a 64-bit channel and the data width of the ranks is determined to be 32 bits, and wherein the clock and chip select signals pertaining to two ranks are synchronized.

18. The method of claim 13, wherein the one or more memory modules is a single memory module that is connected to the memory controller via two channels each of which includes two 32-bit subchannels.

19. The method of claim 18, wherein the data width of the ranks is 16 bits.

20. The method of claim 18, wherein the data width of the ranks is 8 bits.

* * * * *